United States Patent [19]

Requardt et al.

[11] Patent Number: 5,097,210

[45] Date of Patent: Mar. 17, 1992

[54] SURFACE COIL FOR A NUCLEAR MAGNETIC RESONANCE APPARATUS

[75] Inventors: Hermann Requardt; Peter Erhard, both of Erlangen, Fed. Rep. of Germany

[73] Assignee: Siemens Aktiengesellschaft, Munich, Fed. Rep. of Germany

[21] Appl. No.: 522,116

[22] Filed: May 11, 1990

[30] Foreign Application Priority Data

May 11, 1989 [EP] European Pat. Off. ......... 89108517.7

[51] Int. Cl.⁵ ............................................... G01R 33/20
[52] U.S. Cl. ..................................... 324/318; 324/322
[58] Field of Search ............... 324/300, 307, 311, 312, 324/313, 314, 318, 322; 128/653 A; 335/299

[56] References Cited

U.S. PATENT DOCUMENTS

| | | | |
|---|---|---|---|
| 4,881,034 | 11/1989 | Kaufman et al. | 324/318 |
| 4,924,868 | 5/1990 | Krause et al. | 128/653 SC |
| 4,975,644 | 12/1990 | Fox | 324/318 |

OTHER PUBLICATIONS

"Society of Magnetic Resonance in Medicine" *Book of Abstracts*, vol. 2, 7th Annual Meeting & Exhibition Aug. 20–26, 1988 San Francisco, Calif. U.S.A.

"Society of Magnetic Resonance in Medicine" *Works in Progress*, 7th Annual Meeting & Exhibition Aug. 20–26, 1988, San Francisco, Calif., U.S.A.

*Primary Examiner*—Michael J. Tokar

[57] ABSTRACT

A surface coil for a nuclear magnetic resonance apparatus has a number of conductor sections arranged relative to each other. These sections can be connected to one another to a reception unit by employing switches to enclose a preferable conductor geometry to obtain a localized image. The active coil segments form reception loops of various size and/or position. Every possible reception loop which may be created by activating various segments contains both a first variable capacitance and a second variable capacitance serving as a serial connection between the reception loop and the signal line or the signal reference line. Such an arrangement allows for activation of individual coil segments which are tuned to the resonance frequency of the nuclear magnetic resonant apparatus and which are adapted to the impedance of the input lines of the evaluation unit.

17 Claims, 3 Drawing Sheets

SURFACE COIL FOR A NUCLEAR MAGNETIC RESONANCE APPARATUS

BACKGROUND OF THE INVENTION

1. Field of the Invention

The present invention relates to an adjustable surface coil of the type suitable for obtaining nuclear magnetic resonance signals within a localized region from an examination subject.

2. Description of Prior Art

A surface coil having numerous conductor sections arranged relative to each other, with switches connecting the conducting sections in different combinations, permits the use of a single surface coil to be used in the examination of different localized regions without physically displacing the coil. In such a coil, which is disclosed in European Application EP Al 0 280 908, the different combinations of conductor sections, when connected, may form a rectangle which is adjacent to, or overlaps, a rectangle of unconnected sections. Further, it is possible to sequence the active segments in alignment with the geometry of the spine, such that localized image can be obtained with high resolution, and the need to move the patient is eliminated.

SUMMARY OF THE INVENTION

It is an object of the present invention to further improve the initially recited surface coil by developing a configuration by which tuning and adaptation of the surface coil become possible. The above object is achieved in accordance with the principles of the present invention in a surface coil having active segments tuned to the resonant frequency of the radio-frequency unit, and adapted to the impedance of either the signal line or the signal reference line.

DESCRIPTION OF THE PREFERRED EMBODIMENTS

Figure 1:
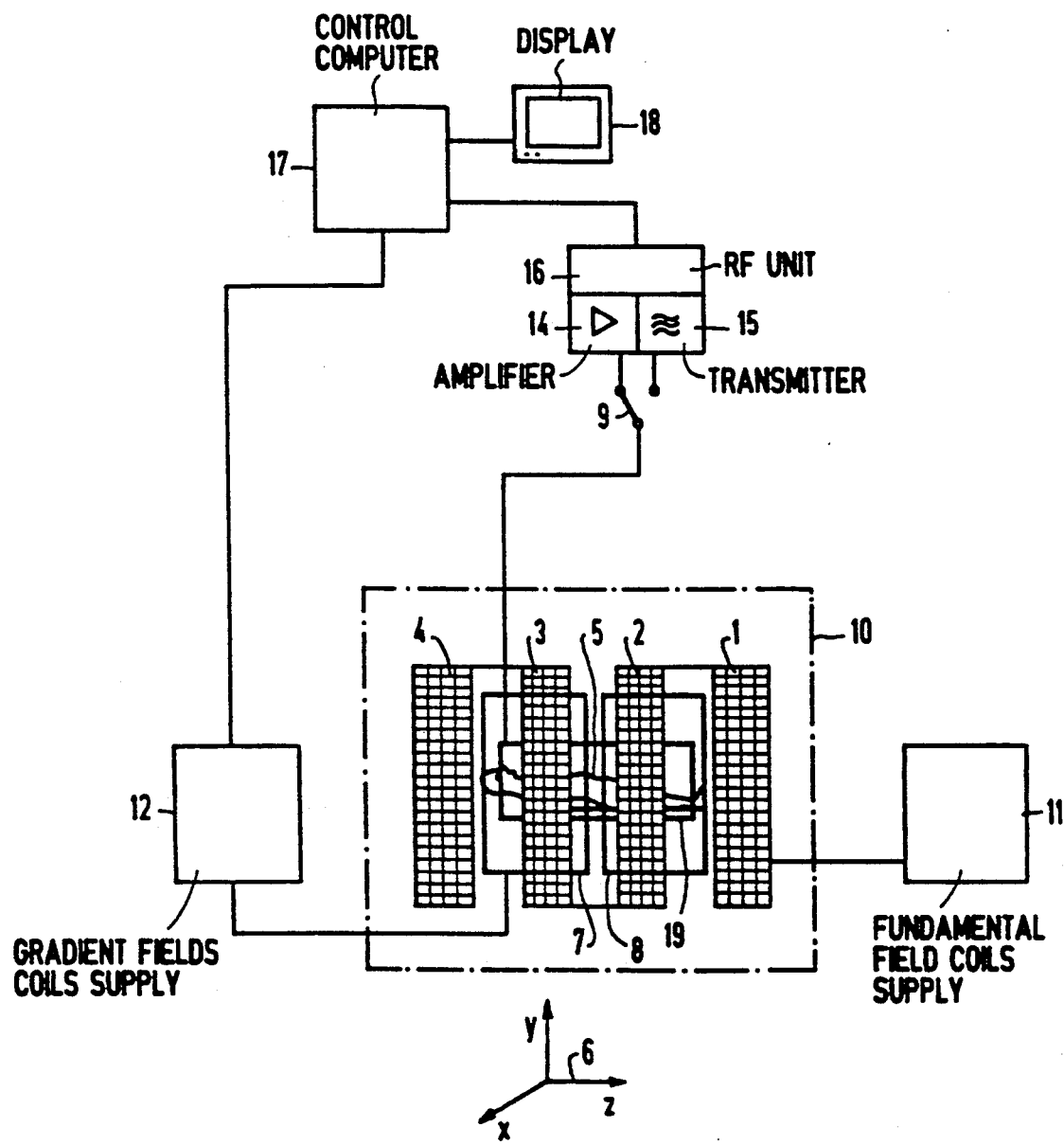
FIG. 1 is a schematic block diagram of a nuclear magnetic resonance apparatus of the type in which the surface coil of the present invention may be used.

The basic components of a nuclear magnetic resonance apparatus, of the type in which the surface coil disclosed and claimed herein may be used, are shown in FIG. 1. The apparatus includes coils 1, 2, 3 and 4 for generating a fundamental magnetic field in which, for medical uses, a patient 5 to be examined is disposed. The patient 5 is also disposed within gradient fields respectively generated by a plurality of gradient coils. These gradient fields are orthogonal, as demonstrated by the representative orientations of the coordinate system 6. Only the gradient coils 7 and 8 are shown in FIG. 1 for the purpose of clarity. The gradient coils 7 and 8 generate a gradient field in the x-direction in combination with a pair of identical gradient coils disposed oppositely thereto. Similar sets of gradient coils (not shown) for generating a gradient field in the y-direction are disposed parallel to, as well as above and below, the patient 5. Gradient coils for generating a gradient field in the z-direction are disposed transversely relative to the longitudinal axis of the patient 5, at the patient's feet and head. The apparatus also includes a body resonator 9 functioning as an antenna for inducing the nuclear magnetic resonance signals in the patient 5. A surface coil 19 acquires the resulting nuclear magnetic resonance signals. The surface coil 19 may alternatively serve the purpose of generating the nuclear magnetic resonance signals, in place of the body resonator 9.

The actual examination instrument, composed of the coils 1, 2, 3, 4, and 8, in which the patient 5 is disposed is bound by the dot-dashed lines 10. A power supply 11 is provided for operating the fundamental field coils 1 through 4, and the gradient coils are supplied by a power supply 12. A radio-frequency transmitter 14, controlled by a process computer 17, is connected to the body resonator 9. The surface coil 19 is also connected to the process computer 17 via a signal amplifier 15. A display 18 is connected to the output of the computer 17 for visual representation of an image of the localized region. The transmitter 14 and the signal amplifier 15 are part of a radio-frequency unit 16 for signal generation and registration.

Figure 2:
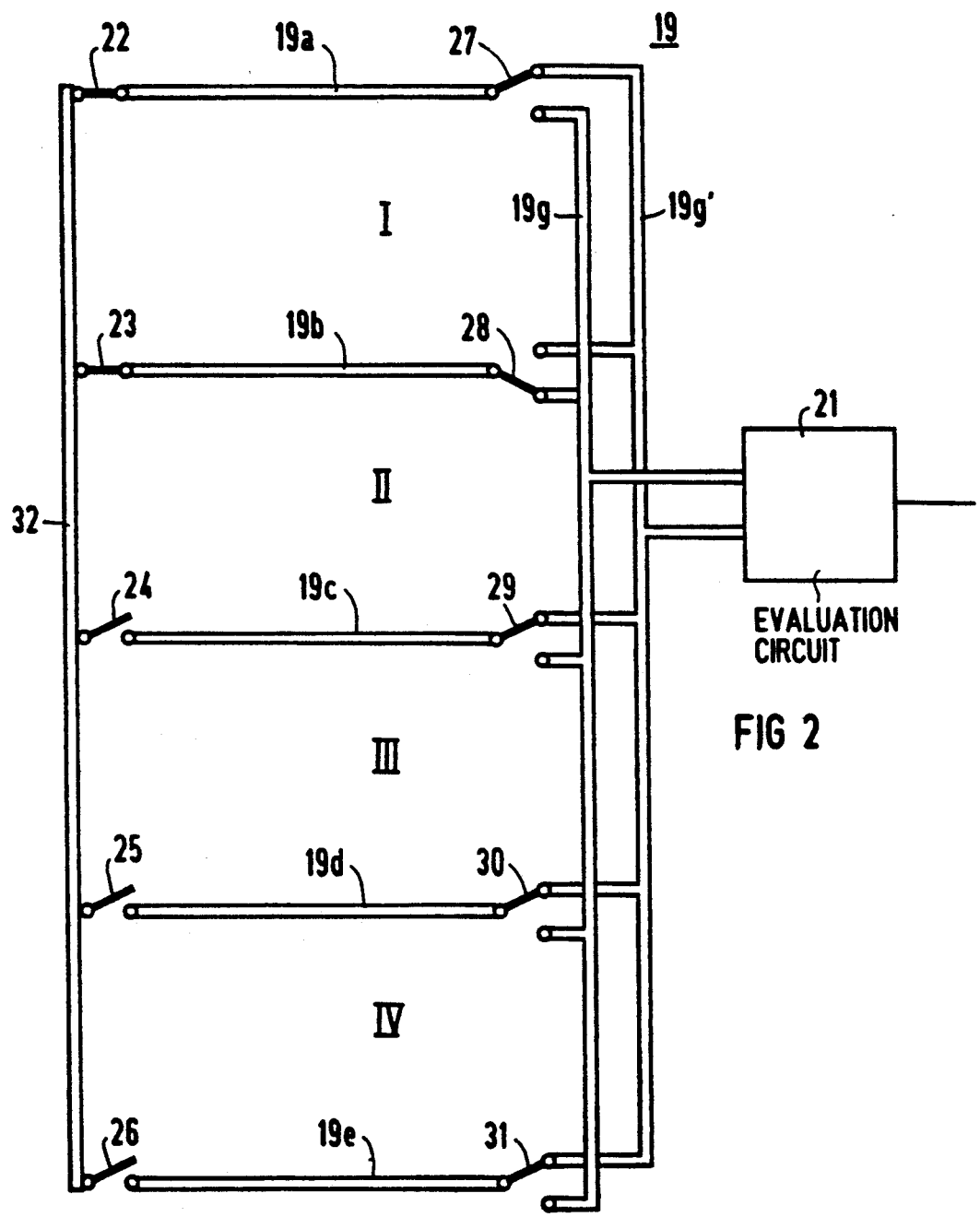
FIG. 2 is a schematic plan view of the structure of the known surface coil.

FIG. 2 shows a known surface coil 19, as described in EP Al 0 280 908 mentioned above. One end of each of the transverse conductors 19a–19e is connected by a respective switch 22–26 to the outside conductor 32. The other end of each transverse conductor 19a–19e is optionally connected via a switch-over means 27–31 to a part 19g, connected to a reception unit 21 at a first terminal and a part 19g' is connected to the reception unit 21 at a second terminal. This configuration allows successive sections of the surface coil 19 to be connected to the reception unit 21, depending on the position of the switches 22–31. Thus, one or more of the surface elements I–IV can be activated. For example, when switches 22 and 23 are closed, switch 27 is connected to the outside conductor 19g', and the switch 28 is connected to the outside conductor 19g, then section 1 of the surface coil 19 is connected to the reception unit 21, where conductor 19a is connected to the second terminal of the reception unit 21 via 19g' and conductor 19b is connected to the first terminal of the reception unit 21 via 19g. With the corresponding drive of the switches 22–31, the sections I–IV can be successively connected to the reception unit 21 and thus, the spiral column can be imaged without moving the patient or the surface coil.

The sensitivity of the output signal of the surface coil may be further improved by tuning the resonant frequency of the individual coil segments to that of the radio-frequency unit, as well as matching the impedance of the signal line to the signal reference line.

Figure 3:
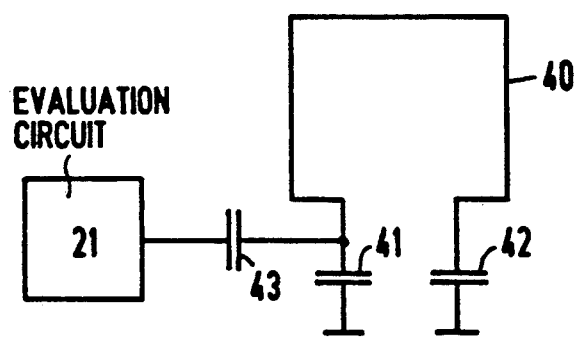
FIG. 3 is a schematic plan view of a single reception loop.

FIG. 3 is a schematic representation of a single loop of such an arrangement allowing for tuning and adaptation. A conductor loop 40 consists of a segment of the surface coil 19, the two ends of the conductor loop being connected to ground via capacitors 41 and 42. Proper selection for the value of the capacitors 41 and 42 will therefore allow the loop 40 to become resonant. Such an arrangement becomes ground-symmetric and thus, more insensitive to detuning. The signal received by the reception loop 40 is seen by the capacitor 43, whereby this capacitor is adjusted such that the impedance of the signal matches that of the feed line or the evaluation unit 21. The present invention allows for a simple integration of the loop arrangement shown in FIG. 3 into the surface coil as shown in FIG. 2.

Figure 4:
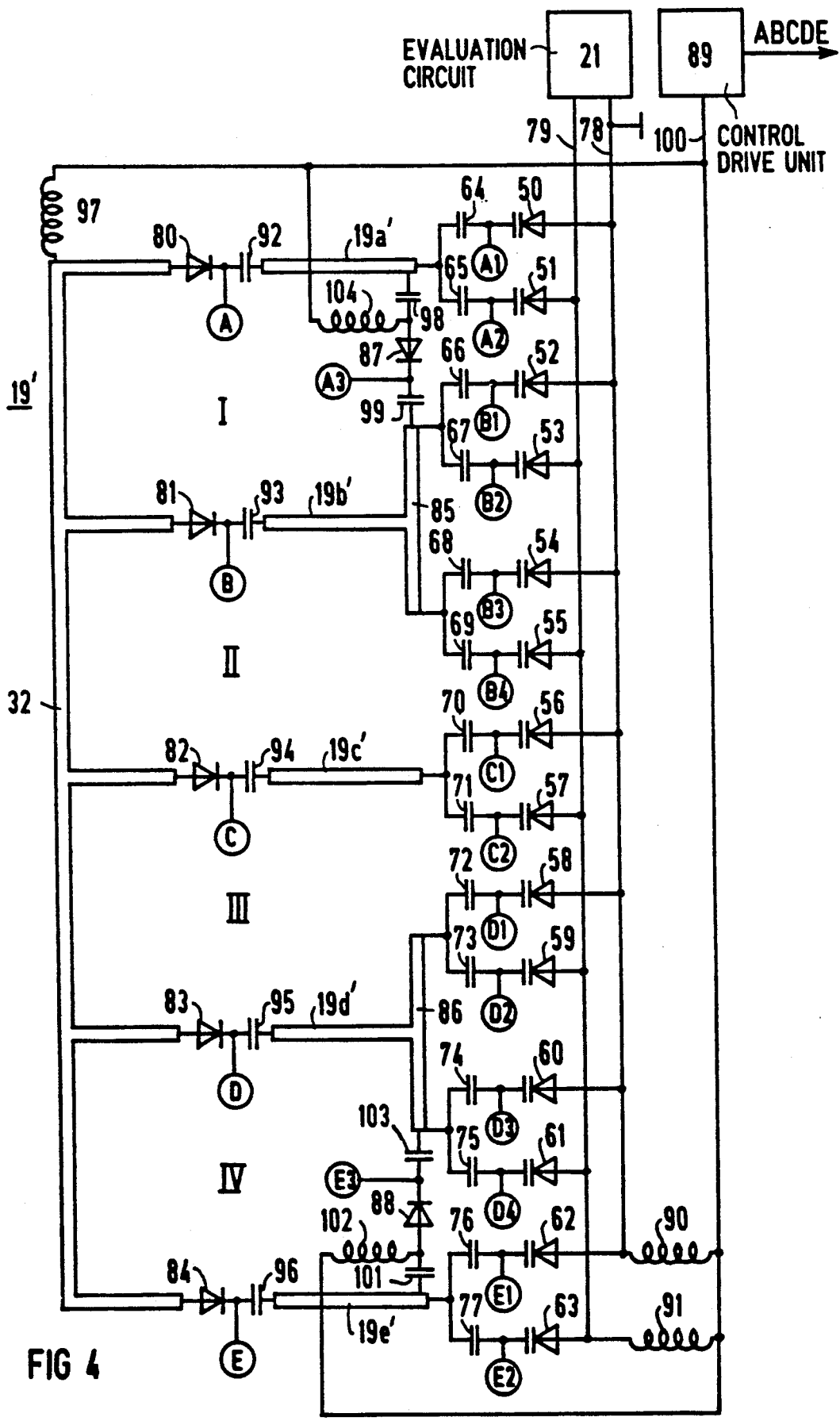
FIG. 4 is a schematic plan view of the arrangement of electronic components within the surface coil, constructed in accordance with the principles of the present invention.

An exemplary embodiment of a surface coil 19' in accord with the principles of the present invention is shown in FIG. 4, which can be used as the surface coil 19 in FIG. 1. The surface coil 19' is composed of outside conductors 32, 85 and 86 and transverse conductors 19a'–19e' interposed with and orthogonal to the outside conductors. In the drawing, it will be understood that the jacketed portions of the conductor are not to scale with respect to the remainder of the conductor sections, since it is necessary in the drawing to leave room to show the components connected between the sections.

The transverse conductors 19a', 19c' and 19e' are serially connected to a signal reference line 78 via a connecting means, consisting of a capacitive element and a biased current conducting element. For example, conductor 19a' is serially connected to the signal reference line 78 by capacitor 64 and varactor-diode 50. Conductors 19c' and 19e' are similarly connected by capacitors 70, 76 and varactor-diodes 56, 62 respectively. The above described serial connections serve as a first controllable capacitance for the transverse conductors 19a', 19c' and 19e'.

The transverse conductors 19a', 19c' and 19e' are also serially connected to a signal line 79. For example, conductor 19e' is serially connected to the signal line 79 through capacitor 65 and varactor-diode 51. Conductors 19c' and 19e' are similarly connected by capacitors 71, 77 and varactor-diodes 57, 63 respectively. The above described serial connections serve as a second controllable capacitance for the system.

The outside conductors 85 and 86 are also serially connected to the signal reference line 78. Conductor 85 is serially connected to the signal reference line 78 by capacitors 66, 68 and varactor-diodes 52, 54 respectively. Conductor 86 is connected to the signal reference line 78 by capacitors 72, 74 and varactors 58, 60 respectively. Conductor 85 is connected to the signal line 79 by capacitors 67, 69 and varactors-diodes 53, 55 respectively. Conductor 86 is connected to the signal line 79 by capacitors 73, 75 and varactor-diodes 59, 61. Conductor 86 is connected to the signal reference line 78 by capacitors 72, 74, and varactor-diodes 58, 60 respectively. These serial connections serve as a second controllable capacitance for the outside conductor as 85, 86. Conductor 85 is connected to the signal line 79 by capacitors 67, 69, and varactor-diodes 53, 55 respectively. Conductor 86 is connected to the signal line 79 by capacitors 73, 75 and varactor-diodes 59, 61. These serial connections serve as a second controllable capacitance for the outside conductors 85, 86.

Electrically connecting the transverse and the outside conductors allows for tuning the circuit to the RF frequency, and adapting the impedance of the feed line to match that of the evaluation unit, to occur simultaneously. This is achieved when the transverse conductors 19a' and 19e' are electrically connected to the outside conductors 85 and 86. The end of the transverse conductor 19a' is connected with the adjacent end of the outside conductor 85 by the serial connection of capacitor 98 with a PIN diode 87 and capacitor 99. Likewise, the end of the transverse conductor 19e' is connected with the adjacent end of the outside conductor 86 by the serial connection of capacitor 100 with a PIN diode 88 and capacitor 103.

Selection of segments I–IV of the surface coil results in high resolution for a localized image, and is achieved by applying a voltage to cathodes of an appropriate combination of diodes 80–83, 87, 88 and varactor-diodes 50–63 by means of a controlled unit 89. The control drive terminals which select the corresponding PIN diodes and varactor-diodes are characterized with A, A1, A2,...E2. Thus, individual or simultaneous activation of segments I through IV is possible with the circuit configuration in FIG. 4, and results in a simultaneous resonance and impedance adaptation as demonstrated in FIG. 3.

For example, to activate segment I, the corresponding drive/control varactor-diodes 50 and 52 adjust their capacitance such that segment I is resonant. Simultaneously, diodes 80 and 81 become conductive as a voltage is applied to the cathodes of these diodes. The resulting signal is supplied the evaluation unit 21 via either varactor-diode 51 or 53, and the corresponding drive of the selected diode results in impedance adaptation. The capacitance of varactor-diodes 54–63 is adjusted such that the segments II–IV are detuned. All other diodes 82–84, 87 and 88 remain nonconductive.

The use of three voltages allows for simultaneous resonant frequency impedance matching as well as detuning of the PIN diodes and varactor-diodes. The voltages are preset in the control unit 89 by the use of voltage dividers, and switched to the respective PIN diodes and varactor-diodes via analog switches.

The reference line 100 of the control unit 89 is connected to the outside conductor 32 by an inductor 97, to the outside conductor 86 by the inductor 102, to the outside conductor 85 by the inductor 104, to the signal reference line 78 by the inductor 90, and to the signal line 79 by the inductor 91. The reference line 100 supplies a dc voltage to the inductors to activate the PIN diodes and varactor-diodes. PIN diodes 80–84 are activated via inductor 97. Varactor-diodes 50, 52, 54, 56, 58 and 60 are activated via inductor 90. Varactor-diodes 51, 53, 55, 57, 59, 61 and 63 are activated via inductor 91. PIN diodes 87 and 88 are activated via inductors 104 and 102 respectively. This placement of the inductors prevents high-frequency coupling. The choice of capacitance for capacitors 92–96, 64–77 and 98, 99, 101, 103 allows for each control signal fed at a constant voltage only to affect the respectively allocated diode.

It is important when connecting the various connector segments to form a loop of selected size or location that the signal reference line 78 not be connected so as to be a part of the loop. For example, if the conductors 19a and 19e were respectively connected to the reference line 78 only via varactor-diodes 50 and 62, the above mentioned desired result would occur. Therefore, PIN diodes 87 and 88 are provided so that a loop can be formed which does not include the portion of the reference line 78 between the varactor-diodes 50 and 62.

Activation of segments I–IV simultaneously is achieved by driving PIN diodes 87 and 88 varactor-diodes 54 and 58, which is allows for inclusion of the outside conductors 85 and 86, and an enclosed reception loop results for the entire surface coil.

To prevent the transmission of high frequency signals arising from the effect of the high-frequency irradiation on the control lines which drive the diodes and varactor-diodes, the transverse and outside conductors 32, 19a'–19e', 85 and 86 are made of conduit and the control lines are contained therein, thus shielding the control lines.

It is thus possible with a surface coil 19' described above to activate various segments with ease, and simultaneously to adapt the resonance and impedance of the system. These characteristics allow for the rapid change from one segment to another, thus allowing switching to ensue in the frame-work of a slice selection, giving a pulse sequence for the slice selective excitation of nuclear spins. Thus, continuous imaging of the localized area for examination can occur in slice-by-slice fashion without the interruption of the pulse sequences for the excitation of the nuclear spins when switching from one segment to another.

WE CLAIM AS OUR INVENTION:

1. A surface coil for use in a nuclear magnetic resonance apparatus for examining a patient, and having means for generating a fundamental magnetic field, and means for generating a plurality of gradient fields in which said patient is disposed, means for inducing nuclear magnetic resonance signals in said patient, said surface coil detecting and transmitting said nuclear magnetic resonance signals, said surface coil being connected via a signal line and a reference line to an evaluating circuit for said nuclear magnetic resonance signals, and said evaluating circuit having an impedance associated therewith, said surface coil comprising:

a plurality of conductor sections arranged relative to each other and adapted for circumscribing different areas, regions and geometries in a plurality of respective combinations having respectively different widths so that said combinations geometrically conform to a local region of interest;

switching means for selectively electrically connecting different groups of said plurality of conductor sections together so that said different areas and different regions can be examined without physical displacement of said conductor sections to form said combinations; and tuning means for simultaneously tuning a combination of conductor sections selected by said switching means to a selected resonant frequency and to the impedance of said circuit for evaluating nuclear magnetic resonance signals, said tuning means including a first variable capacitance connected between the selected combination of conductor sections and said reference line, and second variable capacitance connected between the selected combination of conductor sections and said signal line.

2. A surface coil as claimed in claim 1 wherein said first variable capacitance comprises a varactor.

3. A surface coil as claimed in claim 1 wherein each of said first and second variable capacitances is a varactor.

4. A surface coil as claimed in claim 1 wherein said plurality of conductor sections includes first and second outside conductors and a plurality of transverse conductors disposed between said first and second outside conductors, each transverse conductor having first and second terminals, and wherein said first variable capacitance is a variable capacitor connected between each of said second terminals and said reference line and wherein said second variable capacitance is a variable capacitor connected between each of said second terminals and said signal line.

5. A surface coil as claimed in claim 4 further comprising a controllable switch connected between the first terminal of each transverse conductor and said first outside conductor.

6. A surface coil as claimed in claim 4 wherein the second outside conductor directly connects to the second terminal of some of said transverse conductors, said second outside conductor comprising a plurality of second conductor sections, and each end of said second conductor sections connecting through a respective third variable capacitance to the reference line and through a respective fourth variable capacitance to the signal line.

7. A surface coil as claimed in claim 4 wherein the second terminals of two outermost ones of said transverse conductors are connected through respective first and second controllable switches to ends of said second outside conductor.

8. A surface coil according to claim 4 wherein the first variable capacitance is connected between said reference line and said transverse conductor second terminal by a first capacitor, and wherein said second variable capacitance is connected between said signal line and said transverse conductor second terminal via a second capacitor, and wherein respective first and second control voltages are applied at a junction between the first capacitor and first variable capacitance and at a junction between the second capacitor and second variable capacitance.

9. A surface coil according to claim 1 wherein said switching means includes a control drive unit means for generating control signals for switching diodes connected at respective ends of said transverse conductors, said control drive unit means having a reference line connecting via respective first and second inductors to said evaluating circuit reference line and signal line.

10. A surface coil according to claim 1 wherein said switching means comprises a plurality of PIN diodes.

11. A surface coil according to claim 1 wherein the plurality of conductor sections comprise first and second outside conductors and a plurality of transverse conductors, the transverse conductors each having a first terminal and a second terminal, and wherein the switching means comprises a respective diode connected in series with a capacitor between the first terminal of the respective transverse conductor and the first outside conductor, and wherein a control drive unit means has respective control drive outputs which connect to respective junctions between respective ones of said series connected diodes and capacitors.

12. A surface coil according to claim 11 wherein said control drive unit means has a reference line which connects via an inductor to the first outside conductor.

13. A surface coil according to claim 4 wherein a control drive means is provided for providing control drive signals for said switching means and wherein a series circuit formed of a first capacitor, controlled switch, and a second capacitor connect between the second terminals of outermost ones of said transverse conductors and said ends of second outside conductor, said control drive unit means having a reference line, and said reference line connecting through respective first and second inductors to respective junctions between the respective first capacitor and respective controlled switch.

14. A surface coil according to claim 4 wherein a control drive unit means is provided having a plurality of control lines and wherein respective control lines connect to control respective switching diodes for said switching means, said conductor sections comprising shielded conduit and the control lines being guided within at least some of said conduits.

15. A nuclear magnetic resonance apparatus surface coil system comprising:
a plurality of conductor sections arranged to form a plurality of reception loops; switching means connected to the conductor sections for activating reception loops; an evaluation circuit means having a signal line and reference line which connect via variable capacitance means to the reception loops; and
control signal means connecting to the variable capacitance means for tuning reception loops which are activated to a desired resonance frequency, for matching an impedance associated with the activated reception loop to the signal line, and for detuning reception loops which are not activated.

16. A method for operating a nuclear magnetic resonance apparatus surface coil system comprising the steps of:
providing a plurality of conductor sections arranged to form a plurality of reception loops;
providing an evaluation circuit having a signal line and reference line which connect via a variable capacitance means to the reception loops;
controlling switches associated with the reception loops for selectively activating one or more of the reception loops; and
controlling variable capacitance means for tuning reception loops which are activated to a desired resonance frequency, for matching an impedance associated with the activated reception loop to the signal line, and for detuning reception loops which are not activated.

17. A surface coil for a nuclear magnetic resonance device for establishing a spectra or pictures of an examination subject, comprising:
an arrangement of conductors forming a plurality of reception loops;
an evaluation unit means connected to the arrangement of conductors via a signal line;
switching means associated with the reception loops for selectively activating one of more of the loops; and
controllable variable capacitance means associated with the reception loops for tuning the reception loops in a desired fashion.

* * * * *